(12) United States Patent
Feng et al.

(10) Patent No.: US 9,508,715 B1
(45) Date of Patent: Nov. 29, 2016

(54) SEMICONDUCTOR STRUCTURE

(71) Applicant: UNITED MICROELECTRONICS CORP., Hsin-Chu (TW)

(72) Inventors: Li-Wei Feng, Kaohsiung (TW); Chien-Ting Lin, Hsinchu (TW); Shih-Hung Tsai, Tainan (TW); Ssu-I Fu, Kaohsiung (TW); Hon-Huei Liu, Kaohsiung (TW); Jyh-Shyang Jenq, Pingtung County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/817,217

(22) Filed: Aug. 4, 2015

(30) Foreign Application Priority Data

Jun. 29, 2015  (TW) .............................. 104120872 A

(51) Int. Cl.
*H01L 27/088* (2006.01)
*H01L 21/8234* (2006.01)
(52) U.S. Cl.
CPC ... *H01L 27/0886* (2013.01); *H01L 21/823431* (2013.01)

(58) Field of Classification Search
CPC ............... H01L 21/81; H01L 21/7624; H01L 21/31051; H01L 27/1211; H01L 29/66545
See application file for complete search history.

(56) References Cited

U.S. PATENT DOCUMENTS

| 8,426,923 | B2 |  | 4/2013 | Lee |  |
|---|---|---|---|---|---|
| 2010/0151656 | A1 | * | 6/2010 | Kim | .................. H01L 21/76232 438/435 |
| 2015/0206956 | A1 | * | 7/2015 | Kim | .................. H01L 29/66795 438/294 |
| 2015/0332934 | A1 | * | 11/2015 | Yu | ..................... H01L 29/66795 257/288 |
| 2016/0118414 | A1 | * | 4/2016 | Singh | .................. H01L 27/1211 257/347 |

* cited by examiner

*Primary Examiner* — Phuc Dang
(74) *Attorney, Agent, or Firm* — Winston Hsu; Scott Margo

(57) ABSTRACT

The present invention provides a semiconductor structure including a substrate, having a recess disposed thereon. Two first protruding portions are disposed on two sides of the recess respectively, an epitaxial layer is disposed in the recess, and an insulating layer is disposed on the substrate. A top portion of the first protruding portion is higher than a top surface of the insulating layer.

19 Claims, 5 Drawing Sheets

US 9,508,715 B1

SEMICONDUCTOR STRUCTURE

BACKGROUND OF THE INVENTION

1. Field of the Invention

The invention relates to a semiconductor structure and fabrication method thereof, and more particularly, to a semiconductor structure having an epitaxial layer with better quality.

2. Description of the Prior Art

With the trend in the industry being towards scaling down the size of the metal oxide semiconductor transistors (MOS), three-dimensional or non-planar transistor technology, such as fin field effect transistor (FinFET) technology has been developed to replace planar MOS transistors. Since the three-dimensional structure of a FinFET increases the overlapping area between the gate and the fin structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the finFET can be controlled by adjusting the work function of the gate.

Nevertheless, conventional FinFET fabrication of forming recesses after removing part of fin structures to accommodate the growth of epitaxial layer typically causes the fin structures to be lower than the surrounding shallow trench isolation (STI) as a result of over-etching, thereby influencing the formation of epitaxial layer afterwards. Hence, how to improve the current FinFET fabrication process for resolving this issue has become an important task in this field.

SUMMARY OF THE INVENTION

The present invention provides a semiconductor structure comprising a substrate, having a recess disposed thereon. Two first protruding portions are disposed on two sides of the recess respectively, an epitaxial layer is disposed in the recess, and an insulating layer is disposed on the substrate, wherein a top portion of the first protruding portion is higher than a top surface of the insulating layer.

The present invention further provides a method for forming a semiconductor structure, comprising the following steps: first, a substrate is provided, next, a plurality of fin structures are formed on the substrate, and an insulating layer is formed on the substrate. Afterwards, parts of each fin structure are removed, so as to form at least one recess on the substrate, wherein the recess comprises at least two first protruding portions disposed on two sides of the recess respectively, and a top portion of each first protruding portion is higher than a top surface of the insulating layer, and an epitaxial layer is then formed in the recess.

The feature of the present invention is that during the step for forming the fin structure on the substrate, the fin structures with larger size and disposed near the edge region are kept and used as the dummy fin structures, the dummy fin structures mentioned above are not easy to be removed completely during the step for forming the epitaxial recess, and the first protruding portions will be formed on two sides of the epitaxial recess after the step for forming the epitaxial recess. The top portion of the first protruding portion is higher than the top surface of the adjacent insulating layer. In other words, during the step for growing the epitaxial layer, the material of the sidewall of the epitaxial recess only includes the material of the substrate (such as silicon), and the epitaxial layer will not directly contact the insulating layer, thereby increasing the quality of the epitaxial layer, and further enhancing the performance of the semiconductor device.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 8 are schematic diagrams showing a method for fabricating a semiconductor structure according to a first preferred embodiment of the present invention, wherein:

FIG. 1 to FIG. 3 are cross section schematic diagrams showing the semiconductor structure according to a first preferred embodiment of the present invention;

FIG. 4 is a 3D schematic diagram showing the semiconductor structure according to a first preferred embodiment of the present invention;

FIG. 5 to FIG. 7 are cross section schematic diagrams showing the semiconductor structure according to a first preferred embodiment of the present invention; and FIG. 8 is a 3D schematic diagram showing the semiconductor structure according to a first preferred embodiment of the present invention

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
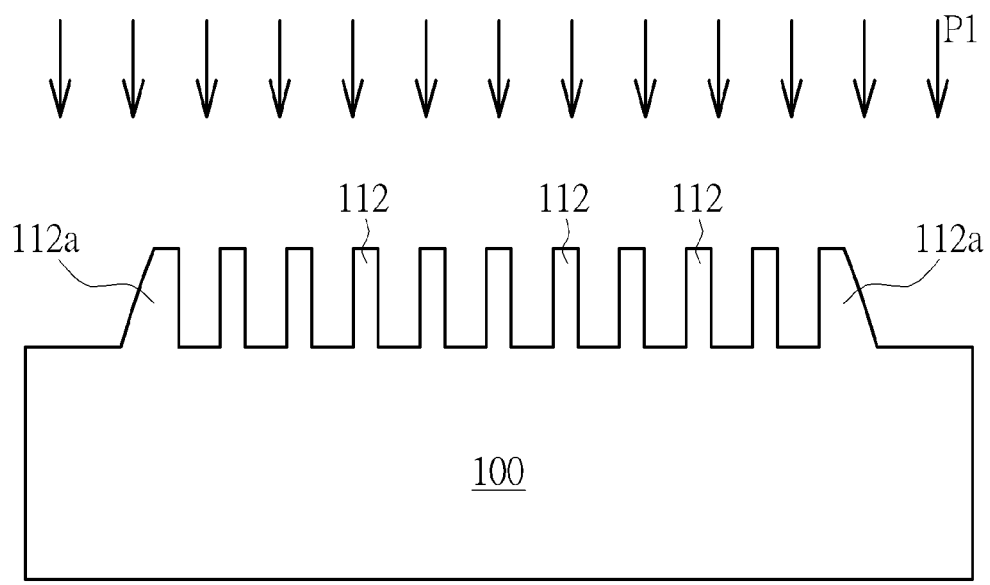

FIG. 1 to FIG. 8 are schematic diagrams showing a method for fabricating a semiconductor structure according to a first preferred embodiment of the present invention. Please refer to FIG. 1. FIG. 1 is a schematic diagram showing a semiconductor structure at the beginning of the fabrication process. As this stage, a semiconductor structure having a substrate 100 and a plurality of fin structures 112 disposed thereon is provided. In addition, the substrate 100 may be chosen from semiconductor substrate such as a bulk silicon substrate, a silicon containing substrate, a III-V semiconductor-on-silicon (such as GaAs-on-silicon) substrate, a graphene-on-silicon substrate, a silicon-on-insulator (SOI) substrate, a silicon dioxide substrate, an aluminum oxide substrate, a sapphire substrate, a germanium containing substrate or an alloy of silicon and germanium substrate.

More precisely, the method for fabricating the fin structures 112 may include the following processes, but not limited thereto. First, a bulk substrate (not shown) is provided and a hard mask layer (not shown) is formed thereon. The hard mask layer is then patterned through a photolithographic and an etching process (photo-etching process), so as to define the location for forming fin structures 112 in the bulk substrate. Afterwards, an etching process is performed to form fin structures 112 in the bulk substrate. After the above processes, the fabrication method for the fin structures 112 is complete. In this case, the fin structures 112 may be regarded as protruding from the surface of the substrate 100 and the compositions of the fin structures 112 and the substrate 100 may be the same, such as monocrystalline silicon. In another case, when the substrate is chosen from a III-V semiconductor-on-silicon substrate rather than the above-mentioned bulk silicon substrate, the main compositions of the fin structures may be the same as that of the III-V semiconductor and differ from that of the underlying substrate.

It is noteworthy that a plurality of the fin structures 112 are disposed on the substrate 100 and arranged paralleled to each other. Preferably, the fin structure 112 that is disposed on the edge (such as the fin structures 112a shown in FIG. 1) has larger size than that of others fin structures 112. For example, it has a larger length or a larger width. Since the fin structures 112a are disposed near the edge region (the region that near the shallow trench isolation formed in the following steps), during the step for forming the fin structures 112 and 112a, the fin structures 112a are not easy to be etched evenly, and the structure of the fin structures 112a may differ from other fin structures 112. In this embodiment, the fin structures 112a have a tilted sidewall after being etched. In other words, the sidewall is tilted to the vertical (normal) direction of the substrate.

Figure 2:
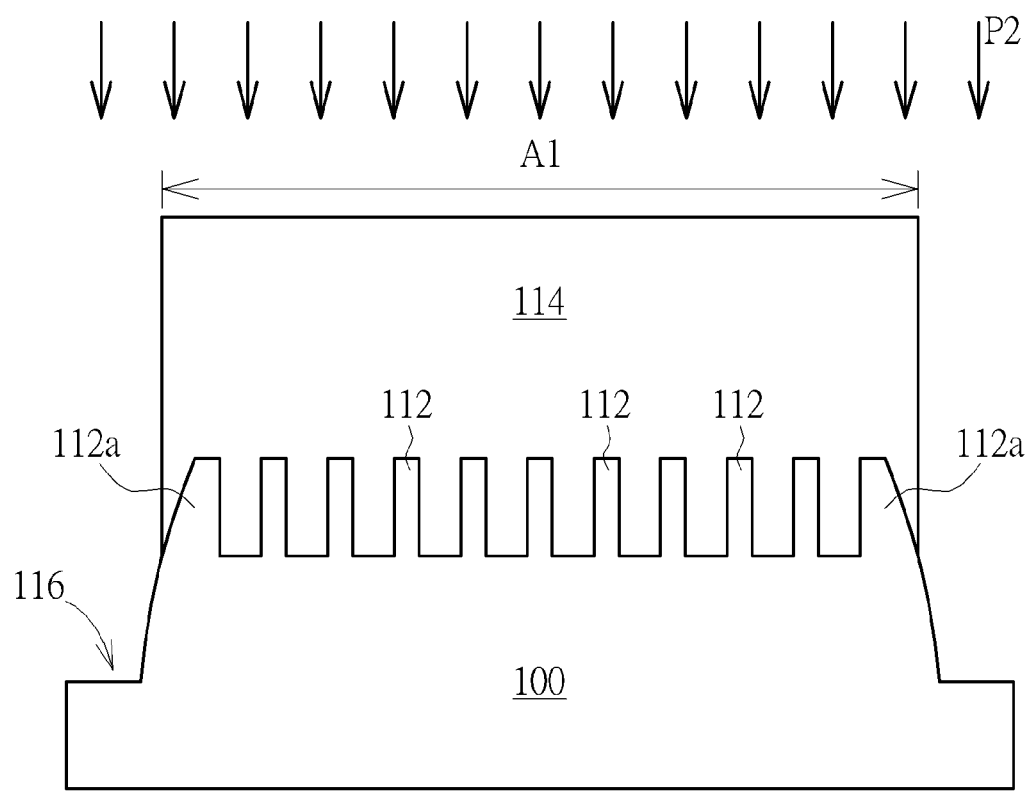

Next, a photoresist layer 114 is used as the hard mask to perform a fin-cut process. As shown in FIG. 2, after the fin-cut process P2 is performed, parts of the fin structure 112 and parts of the substrate are removed, and the recess 116 is therefore formed. Generally, the recess 116 will be filled with the insulating layer in the following steps, so as to form shallow trench isolation (STI). The region A1 which is surrounded by the recess 116 can be defined as the active area of the semiconductor device, namely the region comprising the semiconductor device such as transistors disposed therein. In addition, the sidewall of the recess 116 is adjacent to the sidewall of the fin structure 112a, preferably, both the sidewalls of the recess 116 and the fin structure 112a are tilted planes.

Figure 3:
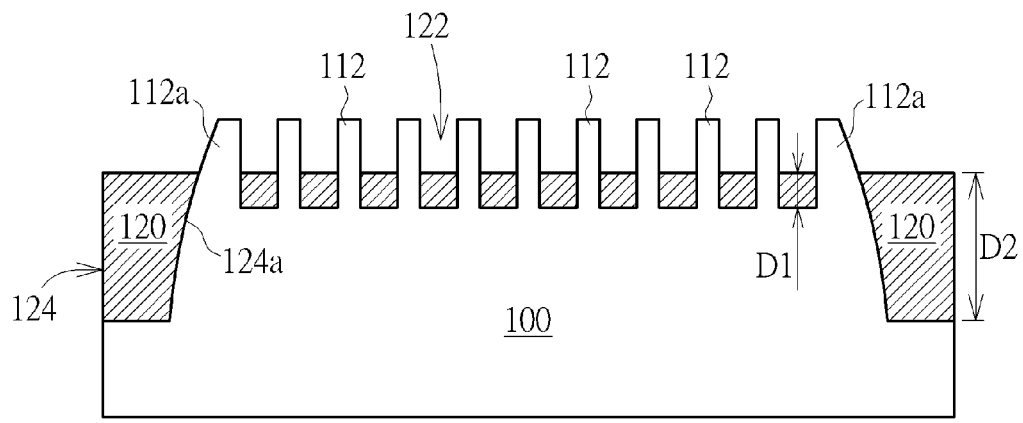

As shown in FIG. 3, after the photoresist layer 114 is removed, a flat insulating layer 120 is entirely formed on the substrate 100, covering the surface of the substrate 100 and also filling in the recesses 116. The insulating layer 120 comprises insulating materials such as silicon oxide or silicon nitride. It is noteworthy that in the present invention, the insulating layer 120 disposed between each of the fin structures 112 can be defined as a first isolation region 122, and the insulating layer 120 disposed in the recess 116 can be defined as a second isolation region 124, the depth D2 of the second isolation region 124 being larger than the depth D1 of the first isolation region 122. In addition, since the recess 116 comprises tilted sidewalls, after the recess is filled by the insulating layer 120, the second isolation region 124 has a tilted sidewall 124a too. Besides, before the insulating layer 120 is formed, a liner can be selectively formed between the substrate 100 and the insulating layer 120, and it should also be within the scope of the present invention.

Figure 4:
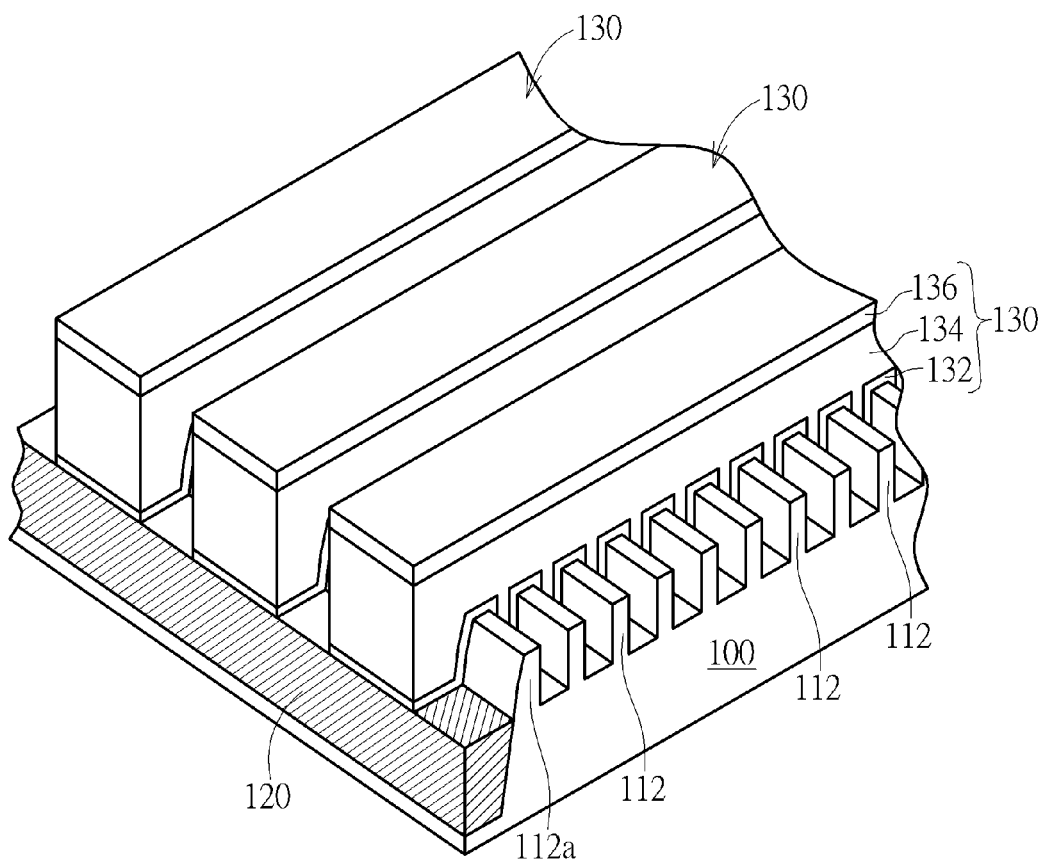

FIG. 4 is a 3D (three dimensional) schematic diagram showing the semiconductor structure according to a first preferred embodiment of the present invention. As shown in FIG. 4, a plurality of gate structures 130 are formed on the insulating layer 120 and cross over each fin structure 112. Each gate structure 130 includes a gate dielectric layer 132, a gate conductive layer 134 and a cap layer 136. The material of the gate dielectric layer 132 may include silicon oxide (SiO), silicon nitride (SiN), silicon oxynitride (SiON), or a high-k dielectric material having a dielectric constant (k value) larger than 4 such as metallic oxide, such as hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof. The material of the gate conductive layer 134 may include undoped polysilicon, heavily doped polysilicon, or one or a plurality of metal layers such as a work function metal layer, a barrier layer and a low-resistance metal layer, etc. The cap layer 136 may include a single-layer structure or multi-layer structure made of dielectric materials such as silicon oxide (SiO), silicon nitride (SiN), silicon carbide (SiC), silicon carbonitride (SiCN), silicon oxynitride (SiON) or a combination thereof. Besides, spacers should also be comprised and disposed on two sides of the gate structure 130, but in order to simplify the figure, spacers are not shown in FIG. 4.

Figure 5:
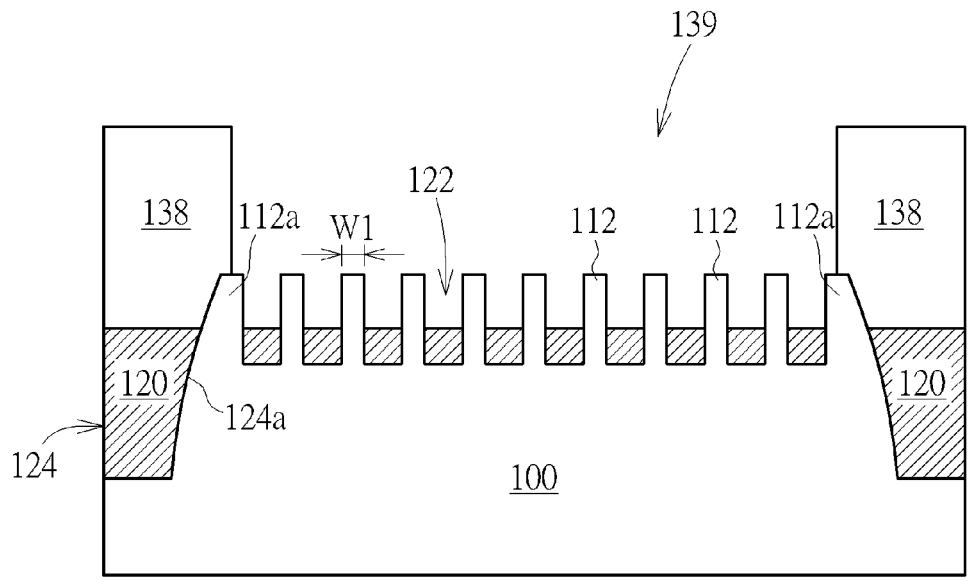
Figure 6:
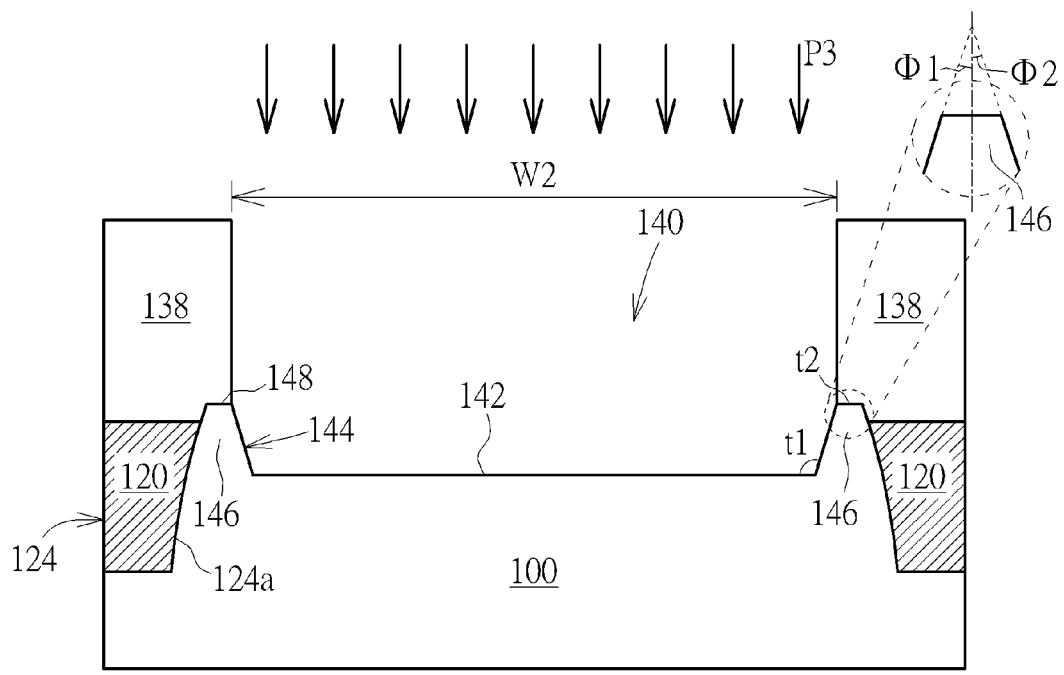

FIGS. 5-6 show the cross section diagrams of the semiconductor structure shown in FIG. 4 after performing an epitaxial recess etching process. As shown in FIG. 5, a patterned photoresist layer 138 is formed on the insulating layer 120, at least covering parts of the fin structure 112a. The patterned photoresist layer includes at least one opening 139, each opening 139 is preferably a strip-shaped structure and arranged paralleled to each other, and each opening 139 disposed between two adjacent gate structures 130 (please also refer to FIG. 4). Afterwards, an etching process P3 is then performed, to form the recesses 140 on two sides of each gate structure 130. During the process for etching the recess 140, not only is the insulating layer 120 partially etched, but the fin structure 112 and the substrate 100 may also be etched simultaneously, or they will be etched in the following etching processes, so a bottom surface 142 of the recess 140 may be lower than the top surface of the substrate 100. When viewed in a cross section diagram, the recess 140 further comprises two sidewalls 144, and an angle t1 between the bottom surface 142 and the sidewall 144 is preferably greater than 90 degrees, but not limited thereto, it can be adjusted according to actual requirements. In addition, during the process for etching the recess 140, the removed fin structure 112 is preferably between 3-12 stripes, therefore, if a width of each fin structure 112 is defined as W1, and a width of the recess 140 is defined as W2, so that the condition of "W2>3W1" is preferably satisfied.

The etching process P3 preferably includes a dry-etching process, such as a multi-step RIE (reactive ion etching) process. At the beginning of the etching process, as shown in FIG. 5, the fin structures 112 and the insulating layer (such as silicon dioxide) 120 between the fin structures 112 are exposed through the opening 139, and an etching process with high etching selectivity (the etching rate for etching the fin structure is much higher than the etching rate for etching the insulating layer) is performed, so as to selectively remove the fin structures 112 until the top surface of the fin structures 112 and top surface of the insulating layer 120 are substantially on a same level. Next, another etching process with 1:1 etching selectivity (the etching rate for etching the fin structure is almost same with the etching rate for etching the insulating layer) is then performed, so as to remove the fin structure 112 and the insulating layer 120 simultaneously. After the insulating layer 120 is entirely removed, another etching process with high etching selectivity can be performed again, so as to selectively remove the silicon material until the recess has enough depth.

In addition, in this embodiment, after the recess 140 is formed, at least one first protruding portion 146 is formed on the substrate 100, wherein the first protruding portion 146 is disposed between the recess 140 and the second isolation region 124. The first protruding portion 146 has an inner sidewall and an outer sidewall, wherein the outer sidewall is the tilted sidewall 124a of the second isolation region 124, and the inner sidewall is the sidewall 144 of the recess 140. As mentioned above, the sidewall 144 of the recess 140 is preferably also a tilted sidewall. Therefore, at least one of the inner sidewall and the outer sidewall of the first protruding portion 146 is a tilted sidewall, and tilted to the vertical (normal) direction of the substrate 100. Besides, the crossing of an extending line of the inner sidewall and an extending line of the outer sidewall includes an acute angle, the acute angle consisted of the angle $\phi 1$ and the angle $\phi 2$, in this embodiment, the angle $\phi 1$ is preferably between 10-40 degrees, and the angle $\phi 2$ is also preferably between 10-40 degrees, but not limited thereto, it can be adjusted according to actual requirements.

Figure 7:
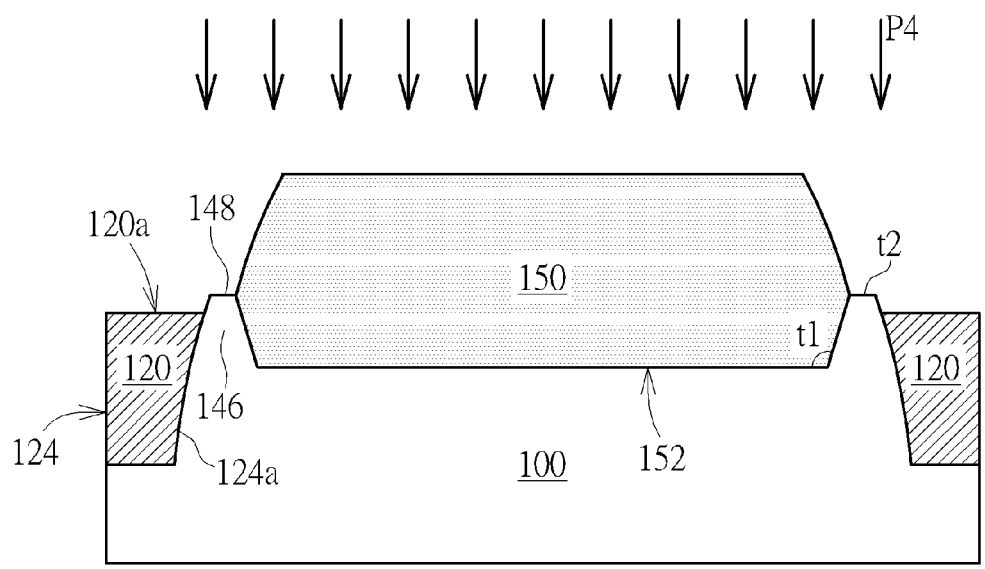
Figure 8:
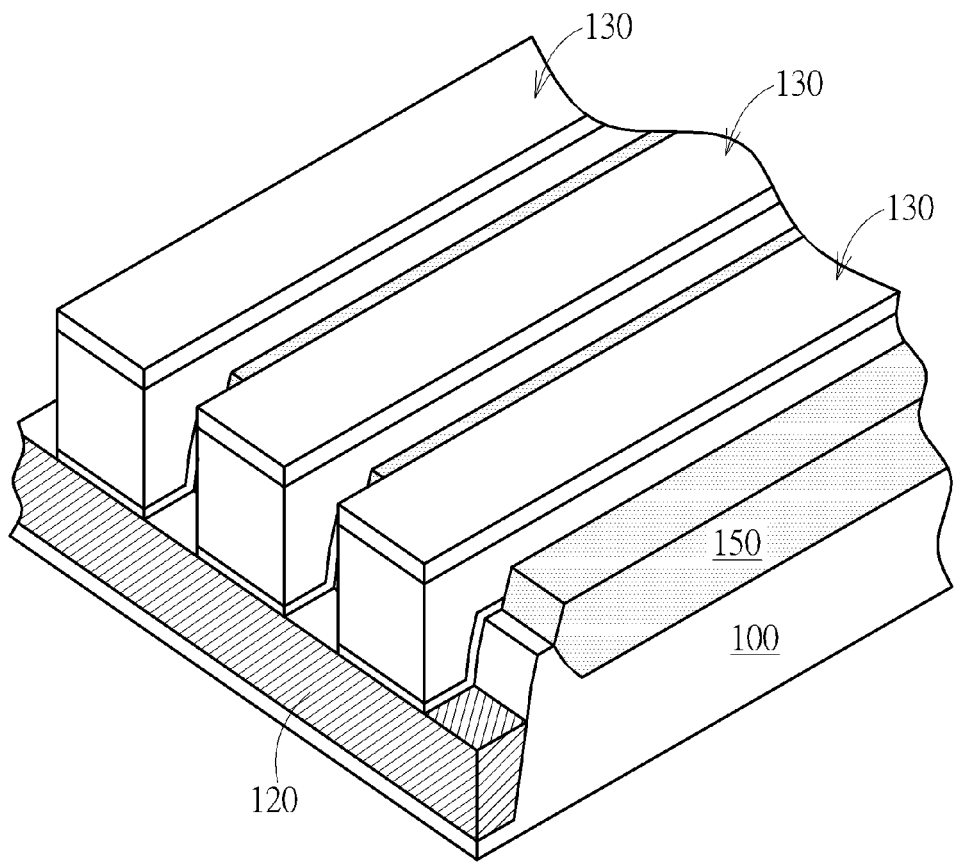
Figure 9:
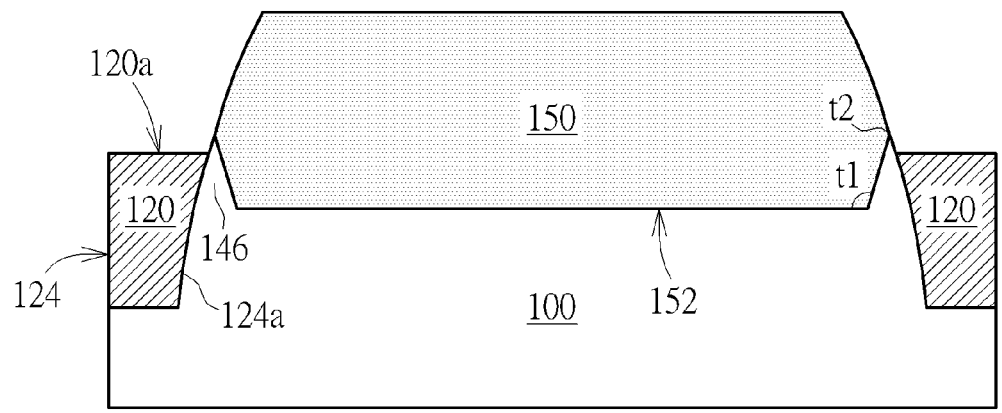
FIG. 9 shows the cross section diagram of the semiconductor structure according to another embodiment of the present invention.

Finally, FIG. 7 shows the cross section diagram of the semiconductor structure shown in FIG. 6 after performing a selective epitaxy growing process. FIG. 8 shows the 3D diagram of the semiconductor structure shown in FIG. 7. As shown in FIGS. 7-8, after the patterned photoresist layer 138 is removed, a selective epitaxy growing (SEG) process P4 is performed to form an epitaxial layer 150 in the recess 140, and the epitaxial layer 150 fills up the recess 140, and disposed between two sides of the gate structure 130. It is well-known to those skilled in the art that in the SEG process P4, the epitaxial layer 150 will grow along each surface of the recess 140, but not grow along the surface of the insulating layer. Therefore, the epitaxial layer 150 has a bottom surface 152, and the bottom surface 152 is lower than a top surface 120a of the insulating layer 120. Furthermore, in this embodiment, a top portion t2 of the first protruding portion 146 is higher than the top surface 120a of the insulating layer 120, and the top portion t2 of the first protruding portion 146 is preferably a trapezoid flat surface 148, but not limited thereto. In another embodiment of the present invention, as shown in FIG. 9, the top portion t2 of the first protruding portion 146 may be a tip.

Figure 10:
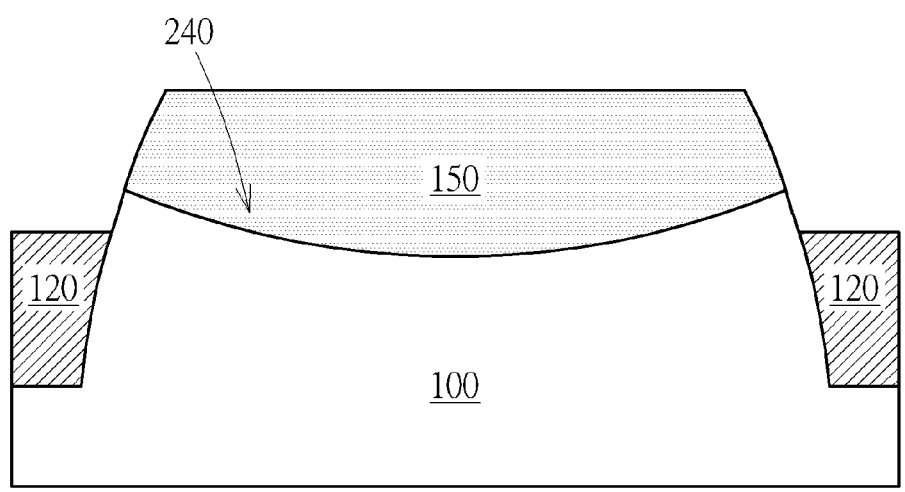
FIG. 10 shows the cross section diagram of the semiconductor structure according to another embodiment of the present invention.

In the embodiment mentioned above, during the process for etching the recess 140, the substrate 100 may also be etched simultaneously. Therefore the recess 140 has a flat bottom surface 142, and the bottom surface 142 is lower than the top surface of the substrate 100. But in another embodiment of the present invention, please refer to FIG. 10, which shows the cross section diagram of the semiconductor structure according to another embodiment of the present invention. In this embodiment, a recess 240 has a curved bottom surface and it is not a flat surface. It should also be within the scope of the present invention.

The feature of the present invention is that during the step for forming the fin structure on the substrate, the fin structures with larger size and disposed near the edge region are kept and used as the dummy fin structures, the dummy fin structures mentioned above are not easy to be removed completely during the step for forming the epitaxial recess, and the first protruding portions will be formed on two sides of the epitaxial recess after the step for forming the epitaxial recess. The top portion of the first protruding portion is higher than the top surface of the adjacent insulating layer. In other words, during the step for growing the epitaxial layer, the material of the sidewall of the epitaxial recess only includes the material of the substrate (such as silicon), and the epitaxial layer will not directly contact the insulating layer, thereby increasing the quality of the epitaxial layer, and further enhancing the performance of the semiconductor device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure, comprising:
   a substrate having a recess disposed thereon, and at least two first protruding portions are disposed on two sides of the recess respectively;
   a plurality of fin structures disposed on the substrate and disposed between the two first protruding portions;
   at least an epitaxial layer disposed in the recess; and
   an insulating layer disposed on the substrate, wherein a top portion of each first protruding portion is higher than a top surface of the insulating layer.

2. The semiconductor structure of claim 1, wherein each first protruding portion includes an inner sidewall and an outer sidewall, and the inner sidewall or the outer sidewall is tilted to the vertical (normal) direction of the substrate.

3. The semiconductor structure of claim 2, wherein the crossing of an extending line of the inner sidewall and an extending line of the outer sidewall includes an acute angle.

4. The semiconductor structure of claim 1, wherein a bottom surface of the epitaxial layer is lower than a top surface of the insulating layer.

5. The semiconductor structure of claim 1, wherein a bottom surface of the recess is a flat surface.

6. The semiconductor structure of claim 1, further comprising a gate structure disposed on the substrate and crossing over each fin structure.

7. The semiconductor structure of claim 1, wherein a width of each fin structure is W1, a width of the recess is W2, and the condition of W2>3W1 is satisfied.

8. The semiconductor structure of claim 1, wherein the epitaxial layer is disposed on every two sides of each gate structure.

9. The semiconductor structure of claim 1, further comprising at least one second recess disposed in the substrate, wherein a depth of the second recess is larger than a depth of the recess.

10. A method for forming a semiconductor structure, comprising:
   providing a substrate;
   forming a plurality of fin structures on the substrate;
   forming an insulating layer on the substrate;
   removing parts of each fin structure, so as to form at least one recess on the substrate, wherein the recess comprises at least two first protruding portions disposed on two sides of the recess respectively, and the plurality of fin structures disposed between the two first protruding portions, and a top portion of each first protruding portion is higher than a top surface of the insulating layer; and forming an epitaxial layer in the recess.

11. The method of claim 10, wherein each first protruding portion includes an inner sidewall and an outer sidewall, the inner sidewall or the outer sidewall is tilted to the vertical (normal) direction of the substrate.

12. The method of claim 11, wherein the crossing of an extending line of the inner sidewall and an extending line of the outer sidewall includes an acute angle.

13. The method of claim 10, wherein a bottom surface of the epitaxial layer is lower than a top surface of the insulating layer.

14. The method of claim 10, wherein a bottom surface of the recess is a flat surface.

15. The method of claim 10, wherein the method for forming the recess on the substrate comprises:

forming a patterned photoresist layer on the insulating layer;

performing an etching process to remove parts of the insulating layer and parts of the fin structure; and removing the patterned photoresist layer.

16. The method of claim 10, wherein each first protruding portion is disposed between the recess and the insulating layer.

17. The method of claim 10, further comprising forming a gate structure, crossing over each fin structure.

18. The method of claim 17, wherein after each fin structure is formed, further comprising forming a second recess in the substrate, wherein a depth of the second recess is larger than a depth of the recess.

19. The method of claim 10, wherein a width of each fin structure is W1, a width of the recess is W2, and the condition of W2>3W1 is satisfied.

* * * * *